US012500064B2

(12) United States Patent
Sasaki et al.

(10) Patent No.: US 12,500,064 B2
(45) Date of Patent: Dec. 16, 2025

(54) CHARGED PARTICLE BEAM APPARATUS AND CONTROL METHOD FOR CHARGED PARTICLE BEAM APPARATUS

(71) Applicant: JEOL Ltd., Tokyo (JP)

(72) Inventors: Takeo Sasaki, Tokyo (JP); Kanako Noguchi, Tokyo (JP); Kazuki Yagi, Tokyo (JP)

(73) Assignee: JEOL Ltd., Tokyo (JP)

( * ) Notice: Subject to any disclaimer, the term of this patent is extended or adjusted under 35 U.S.C. 154(b) by 415 days.

(21) Appl. No.: 18/120,617

(22) Filed: Mar. 13, 2023

(65) Prior Publication Data

US 2023/0290607 A1 Sep. 14, 2023

(30) Foreign Application Priority Data

Mar. 14, 2022 (JP) ................................. 2022-039380
Jan. 18, 2023 (JP) ................................. 2023-005805

(51) Int. Cl.
*H01J 37/28* (2006.01)
*H01J 37/244* (2006.01)
*H01J 37/26* (2006.01)

(52) U.S. Cl.
CPC ............ *H01J 37/28* (2013.01); *H01J 37/244* (2013.01); *H01J 37/265* (2013.01)

(58) Field of Classification Search
CPC ........ H01J 37/28; H01J 37/244; H01J 37/265; H01J 2237/06333; H01J 37/045; H01J 2237/0432; H01J 2237/2802
See application file for complete search history.

(56) References Cited

U.S. PATENT DOCUMENTS 4,538,065 A 8/1985 Miyoshi et al.
5,665,968 A * 9/1997 Meisburger ......... H01J 37/3005 250/306
7,242,013 B2 * 7/2007 Fukuda .................. C23C 16/52 250/492.2

(Continued)

FOREIGN PATENT DOCUMENTS

EP 3951829 A1 9/2002
EP 3364442 A1 * 8/2018 ............ H01J 37/244

(Continued)

OTHER PUBLICATIONS

Office Action issued in JP2023005805 on Jan. 30, 2024.
Extended European Search Report issued in EP23161216.9 on Jul. 28, 2023.

*Primary Examiner* — David A Vanore
(74) *Attorney, Agent, or Firm* — The Webb Law Firm

(57) ABSTRACT

A charged particle beam apparatus for scanning a specimen with a charged particle beam and acquiring a scan image. The charged particle beam apparatus including: an optical system that includes a pulse mechanism for illuminating the specimen with pulses of the charged particle beam, and a deflector that deflects the charged particle beam and scans the specimen with the deflected charged particle beam; and a control unit that controls the optical system. The control unit controls the optical system so as to satisfy T=n×t (n is a natural number). T represents a dwell time of the charged particle beam in each pixel of the scan image, and t represents a cycle of pulses of the charged particle beam.

6 Claims, 10 Drawing Sheets

(56) References Cited

U.S. PATENT DOCUMENTS

| | | | | |
|---|---|---|---|---|
| 8,101,928 | B2 * | 1/2012 | Hill | H01J 37/28<br>250/397 |
| 11,127,562 | B1 | 9/2021 | Kieft et al. | |
| 2007/0158558 | A1 * | 7/2007 | Ward | B82Y 40/00<br>250/309 |
| 2010/0084568 | A1 * | 4/2010 | Lagarec | H01J 37/3005<br>250/397 |
| 2011/0210181 | A1 * | 9/2011 | Edinger | C23F 4/00<br>239/3 |
| 2011/0284744 | A1 * | 11/2011 | Zewail | H01J 37/228<br>250/311 |
| 2012/0025074 | A1 * | 2/2012 | Barbi | G01T 1/20188<br>250/361 R |
| 2012/0120226 | A1 * | 5/2012 | de Jonge | H01J 37/20<br>348/80 |
| 2019/0228945 | A1 | 7/2019 | Sawada | |
| 2020/0090902 | A1 * | 3/2020 | Matsubara | H01J 37/28 |
| 2022/0084783 | A1 * | 3/2022 | Yagi | H01J 37/1477 |
| 2023/0072991 | A1 * | 3/2023 | Hashiguchi | H01J 37/045 |
| 2023/0290607 | A1 * | 9/2023 | Sasaki | H01J 37/28 |
| 2023/0307206 | A1 * | 9/2023 | Tsutsumi | H01J 37/28 |

FOREIGN PATENT DOCUMENTS

| | | | |
|---|---|---|---|
| JP | 2019129073 | A | 8/2019 |
| JP | 202231205 | A | 2/2022 |

* cited by examiner

Frequency:1KHz:1msec
Duty 50%: 0.5msec illumination

Frequency:10KHz:0.1msec
Duty 50%: 50 μ sec illumination

CHARGED PARTICLE BEAM APPARATUS AND CONTROL METHOD FOR CHARGED PARTICLE BEAM APPARATUS

CROSS-REFERENCE TO RELATED APPLICATION

This application claims priority to Japanese Patent Application No. 2022-039380 filed on Mar. 14, 2022 and Japanese Patent Application No. 2023-005805 filed on Jan. 18, 2023, the disclosures of which are hereby incorporated by reference in their entireties.

BACKGROUND OF THE INVENTION

Field of the Invention

The present invention relates to a charged particle beam apparatus, and a control method for the charged particle beam apparatus.

Description of Related Art

In such a charged particle beam apparatus as a transmission electron microscope, a scanning transmission electron microscope, a scanning electron microscope, and a focused ion beam apparatus, an illumination optical system to emit an electron beam, ion beam, or the like, to a specimen is included. The illumination optical system includes a condenser lens, an aperture, and an aberration correction apparatus such as a Cs corrector, for example.

JP-A-2019-129073, for example, discloses an electron microscope equipped with an illumination optical system which includes an aberration correction apparatus to correct spherical aberration and chromatic aberration.

In the above-described charged particle beam apparatus, the illumination dose of the electron beam can be adjusted. For example, in an electron microscope such as a scanning transmission electron microscope, the illumination dose of the electron beam can be adjusted by changing the excitation of the condenser lens to change the spot size. The illumination dose of the electron beam can also be adjusted by changing the size of the aperture of the illumination optical system.

However, if the excitation of the condenser lens is changed, axis alignment and adjustment of the aberration correction apparatus are needed. Further, if the size of the aperture is changed, the aperture has to be adjusted. Moreover, if the size of the aperture is changed, the convergence angle of the electron beam changes. Therefore, if the illumination dose of the electron beam is changed, the conditions of the optical system change, and in some cases the optical system has to be adjusted.

SUMMARY OF THE INVENTION

According to a first aspect of the present disclosure, there is provided a charged particle beam apparatus for scanning a specimen with a charged particle beam and acquiring a scan image, the charged particle beam apparatus including:

an optical system that includes a pulse mechanism for illuminating the specimen with pulses of the charged particle beam, and a deflector that deflects the charged particle beam and scans the specimen with the deflected charged particle beam; and a control unit that controls the optical system, the control unit controlling the optical system so as to satisfy $T=n\times t$ (n is a natural number), where T represents a dwell time of the charged particle beam in each pixel of the scan image, and t represents a cycle of pulses of the charged particle beam.

According to a second aspect of the present disclosure, there is provided a control method for a charged particle beam apparatus that includes an optical system including a pulse mechanism and a deflector, and acquires a scan image by illuminating a specimen with a charged particle beam, the pulse mechanism illuminating the specimen with pulses of the charged particle beam, and a deflector deflecting the charge particle beam and scanning the specimen with the deflected charged particle beam, the method including:

controlling the optical system so as to satisfy $T=n\times t$ (n is a natural number), where T represents a dwell time of the charged particle beam in each pixel of the scan image, and t represents a cycle of pulses of the charged particle beam.

DESCRIPTION OF THE INVENTION

According to an embodiment of the present disclosure, there is provided a charged particle beam apparatus for scanning a specimen with a charged particle beam and acquiring a scan image, the charged particle beam apparatus including:

an optical system that includes a pulse mechanism for illuminating the specimen with pulses of the charged particle beam, and a deflector that deflects the charged particle beam and scans the specimen with the deflected charged particle beam; and a control unit that controls the optical system, the control unit controlling the optical system so as to satisfy T=n×t (n is a natural number), where T represents a dwell time of the charged particle beam in each pixel of the scan image, and t represents a cycle of pulses of the charged particle beam.

In this charged particle beam apparatus, the illumination dose of the electron beam to a specimen can be controlled by using the pulse mechanism to illuminate the specimen with pulses of the electron beam. Further, in this charged particle beam apparatus, T=n×t is satisfied, therefore generation of bright and dark fringes on the scan image, caused by switching the charged particle beam ON/OFF, can be prevented.

According to an embodiment of the present disclosure, there is provided a control method for a charged particle beam apparatus that includes an optical system including a pulse mechanism and a deflector, and acquires a scan image by scanning a specimen with a charged particle beam, the pulse mechanism illuminating the specimen with pulses of the charged particle beam, and a deflector deflecting the charge particle beam and scanning the specimen with the deflected charged particle beam, the method including:

controlling the optical system so as to satisfy T=n×t (n is a natural number), where T represents a dwell time of the charged particle beam in each pixel of the scan image, and t represents a cycle of pulses of the charged particle beam.

In this control method for the charged particle beam apparatus, the illumination dose of the electron beam to a specimen can be controlled by using the pulse mechanism to illuminate the specimen with pulses of the electron beam. Further, in this control method for the charged particle beam apparatus, T=n×t is satisfied, therefore generation of bright and dark fringes on the scan image, caused by switching the charged particle beam ON/OFF, can be prevented.

Preferred embodiments of the invention will now be described in detail with reference to the drawings. It is noted that the following embodiments described below do not unduly limit the scope of the invention as stated in the claims. Further, all of the components described in the following embodiments are not necessarily essential requirements of the invention.

1. First Embodiment

1.1. Electron Microscope

Figure 1:
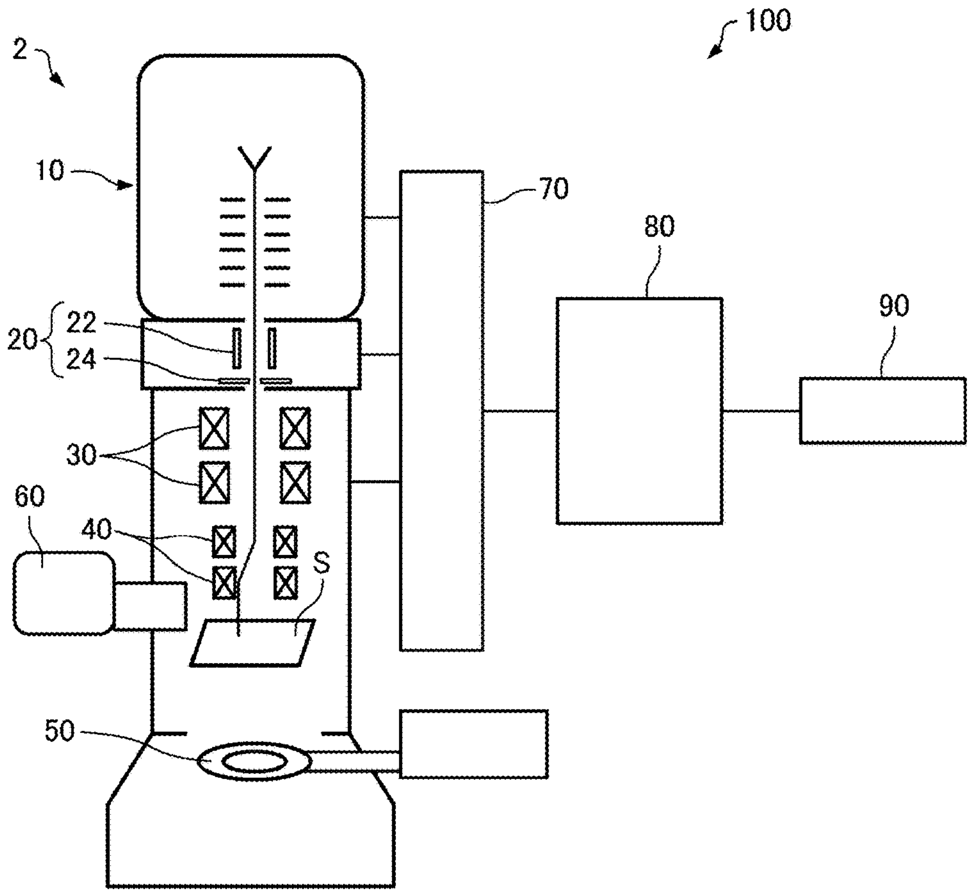
FIG. 1 is a diagram illustrating a configuration of an electron microscope according to the first embodiment.

An electron microscope according to the first embodiment will be described first with reference to the drawings. FIG. 1 is a diagram illustrating a configuration of the electron microscope 100 according to the first embodiment.

The electron microscope 100 is a scanning transmission electron microscope (STEM) that scans a specimen S with an electron beam (an example of a charged particle beam), and acquires a scan image by detecting electrons transmitted through the specimen S.

The scan image is an image acquired by scanning with such a charged particle beam as an electron beam and an ion beam. The scan image includes a bright-field STEM image, a dark-field STEM image, an element distribution map using an energy dispersive X-ray spectrometer (EDS), and an element distribution map using an electron energy loss spectrometer (EELS).

As illustrated in FIG. 1, the electron microscope 100 includes an electron beam source 10, a blanking device 20, an illumination lens system 30, a scanning deflector 40, an electron detector 50, an X-ray detector 60, a control circuit 70, a control unit 80 and an input unit 90.

The electron beam source 10 emits an electron beam. The electron beam source 10 is an electron gun that accelerates electrons, emitted from a cathode, by an anode, and emits an electron beam thereby.

The blanking device 20 is disposed between the electron beam source 10 and the illumination lens system 30. The blanking device 20 controls the electron beam ON/OFF emitted to the specimen S. In other words, the blanking device 20 switches between a state where the electron beam is emitted to the specimen S (ON), and a state where the electron beam is not emitted to the specimen S (OFF).

The blanking device 20 includes an electrostatic deflector 22 and an aperture 24. The electrostatic deflector 22 generates an electrostatic field and deflects the electron beam thereby. The aperture 24 includes an aperture hole through which an electron beam is passed. In a state where the electrostatic deflector 22 does not deflect an electron beam, the electron beam passes through the aperture hole. Therefore, the electron beam is emitted to the specimen S. In a state where the electrostatic deflector 22 deflects an electron beam, the electron beam is blocked at the aperture 24. As a result, the electron beam is not emitted to the specimen S.

The blanking device 20 deflects an electron beam using the electrostatic deflector 22, hence the electron beam can be deflected faster than the case of deflecting an electron beam using a magnetic coil. For example, the electrostatic deflector 22 can deflect an electron beam on the order of nanoseconds. Therefore, the blanking device 20 can switch an electron beam ON/OFF at high-speed. By periodically switching ON/OFF, the blanking device 20 can illuminate the specimen S with pulses of the electron beam to the specimen S.

The blanking device 20 may include an adapter lens (not illustrated) disposed in the previous stage of the electrostatic deflector 22. The adapter lens forms a crossover on the principal surface of the electrostatic deflector 22. By forming the crossover on the principal surface of the electrostatic deflector 22, the emitting position of the electron beam on the specimen S does not move, even if the electron beam is deflected by the electrostatic deflector 22.

The illumination lens system 30 emits an electron beam generated by the electron beam source 10 to a specimen S. The illumination lens system 30 focuses the electron beam and forms an electron probe. The illumination lens system 30 includes a condenser lens and a pre-magnetic field of an objective lens, for example.

The scanning deflector 40 two-dimensionally deflects an electron beam emitted to a specimen S. By deflecting the electron beam using the scanning deflector 40, the specimen S can be scanned with the electron beam (electron probe). The scanning deflector 40 is a magnetic coil, for example, that generates a magnetic field and deflects the electron beam thereby.

In the electron microscope 100, the electron beam source 10, the blanking device 20, the illumination lens system 30, and the scanning deflector 40 constitute the illumination optical system 2 for scanning the specimen S with the electron beam. The illumination optical system 2 may include other lenses, an aperture, and the like (not illustrated).

The electron microscope 100 also includes a specimen stage (not illustrated). In a specimen chamber of the electron microscope 100, a specimen S is positioned by the specimen stage.

The electron microscope 100 also includes an image forming optical system (not illustrated) that guides electrons transmitted through the specimen S to an electron detector 50. The image forming optical system includes an objective lens, an intermediate lens, a projection lens, and the like.

The electron detector 50 detects electrons transmitted through the specimen S. The electron detector 50 is a dark-field STEM detector which has an annular-shaped detection region. For example, the electron detector 50 detects electrons that are inelastically scattered at high angle in the specimen S. By detecting electrons using the electron detector 50, a high angle annular dark-field image (hereafter also called HAADF-STEM image) can be acquired.

The electron detector 50 may be a bright-field STEM detector that detects a transmitted wave and electrons scattered at low angle. The electron microscope 100 may include both the bright-field STEM detector and the dark-field STEM detector.

The X-ray detector 60 detects an X-ray generated in the specimen S when the electron beam is emitted to the specimen S. The X-ray detector 60 is an energy dispersive X-ray spectrometer (EDS detector), for example. By detecting an X-ray using the X-ray detector 60, an X-ray spectrum and an element distribution map can be acquired.

The control circuit 70 receives a control signal from the control unit 80, and controls the illumination optical system 2.

The control unit 80 (information processing apparatus) controls the illumination optical system 2. The control unit 80 includes such a processor as a central processing unit (CPU), and such a storage devices as a random access memory (RAM) and a read only memory (ROM). The storage device stores programs that cause the computer to function as the control unit 80.

The functions of the control unit 80 can be implemented by the processor executing the programs. A part of the functions of the control unit 80 may be implemented by such a dedicated circuit as an ASIC (e.g. gate array).

The input unit 90 is a unit for the user to input information and send the inputted information to the control unit 80. The input unit 90 is such an input devices as buttons, keys, a touch panel type display, and a microphone, for example.

1.2. Operation 1.2.1. Principle

In the electron microscope 100, the electron beam emitted from the electron beam source 10 is focused by the illumination lens system 30 to form the electron probe, and the electron beam is deflected by the scanning deflector 40, whereby a specimen S is scanned with the electron probe. In the electron microscope 100, the specimen S is raster-scanned with the electron probe. Here the blanking device 20 cyclically switches the electron beam ON/OFF, so that the specimen S is illuminated with pulses of the electron beam. In this way, the specimen S is scanned with the pulsed electron beam in the electron microscope 100.

The electrons transmitted through the specimen S are detected by the electron detector 50. The X-ray emitted from the specimen S illuminated with the electron beam is detected by the X-ray detector 60. For example, by detecting the electrons using the electron detector 50 synchronizing with the scanning with the electron probe, a transmission electron microscope image (HAADF-STEM image) can be acquired. Further, by detecting the X-ray using the X-ray detector 60 synchronizing with the scanning with the electron probe, an element distribution map can be acquired.

In the electron microscope 100, the illumination dose of the electron beam to a specimen S can be controlled using the blanking device 20. The illumination dose of the electron beam can also be interpreted as a current amount (probe current) of the electron beam.

The electrostatic deflector 22 can switch the electron beam ON/OFF at high-speed. For example, the electrostatic deflector 22 can switch the electron beam ON/OFF on the order of nanoseconds. The illumination dose of the electron beam can be controlled by operating the electrostatic deflector 22.

Figure 2:
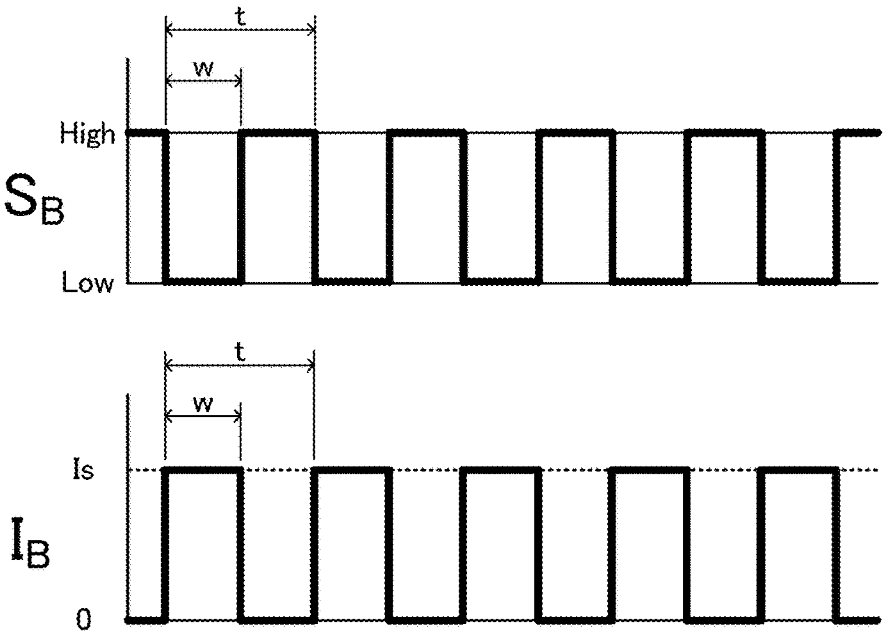
FIG. 2 is a diagram illustrating a blanking signal and current amount of an electron beam.
Figure 3:
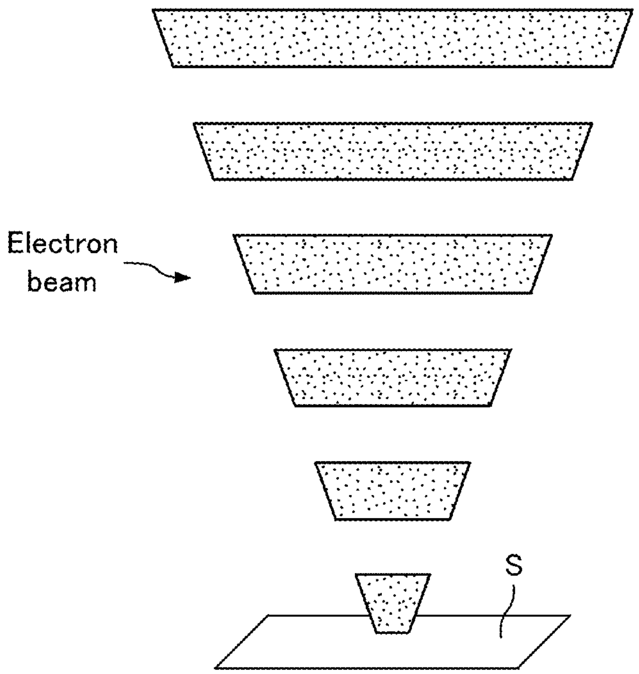
FIG. 3 is a diagram schematically illustrating an electron beam emitted to a specimen.

FIG. 2 is a diagram illustrating a blanking signal $S_B$ to control the electrostatic deflector 22 and a current amount (intensity) $I_B$ of the electron beam emitted to a specimen S. FIG. 3 is a diagram schematically illustrating the electron beam emitted to the specimen S when the electrostatic deflector 22 is operated based on the blanking signal $S_B$ illustrated in FIG. 2.

The electrostatic deflector 22 does not deflect the electron beam when the blanking signal $S_B$ is at Low level. As a result, the electron beam becomes ON and the electron beam having intensity $I_S$ is emitted to the specimen S. The electrostatic deflector 22 deflects the electron beam when the blanking signal $S_B$ is at High level. As a result, the electron beam is blocked, and the electron beam becomes OFF. The blanking signal $S_B$ is a signal in which the High level and the Low level are repeated at a predetermined cycle t. By operating the electrostatic deflector 22 based on the blanking signal $S_B$, pulses of the electron beam are illuminated, as illustrated in FIG. 3.

The illumination dose of the electron beam can be controlled by changing the ratio w/t, that is, a ratio of the time w of not blocking the electron beam with the blanking device 20 with respect to the cycle t ($t \neq w$, $w \neq 0$). The time w can also be interpreted as a time of emitting the electron beam in one cycle, that is, the time when the electron beam is ON in one cycle.

Figure 4:
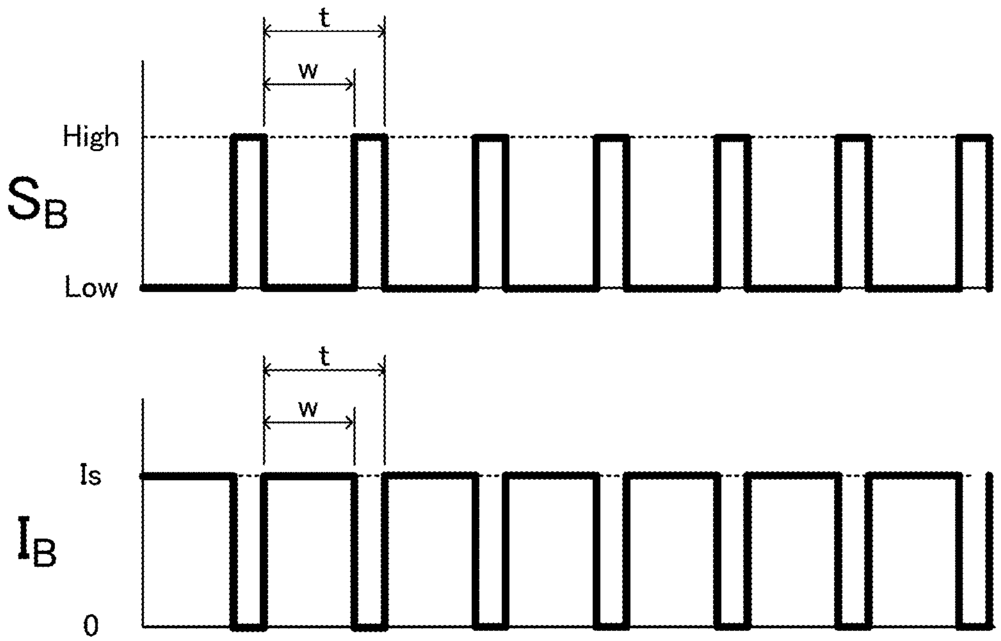
FIG. 4 is a diagram illustrating a blanking signal and a current amount of an electron beam.
Figure 5:
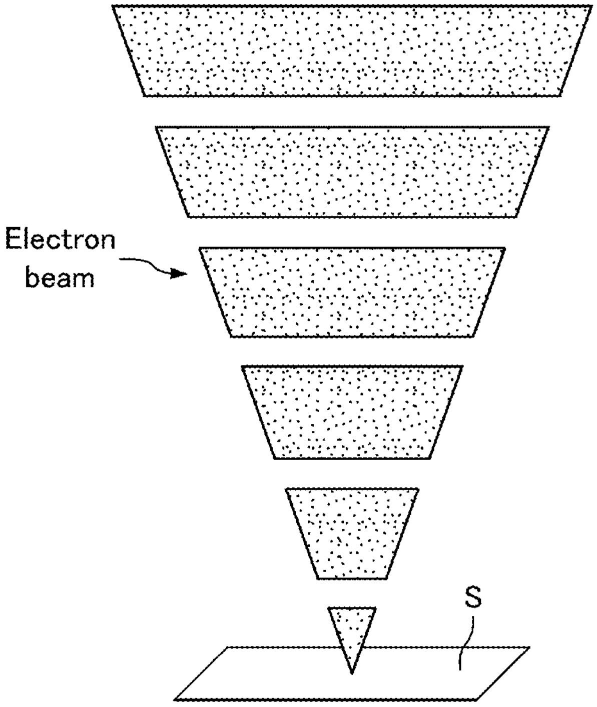
FIG. 5 is a diagram schematically illustrating an electron beam emitted to a specimen.

FIG. 4 is a diagram illustrating a blanking signal $S_B$ to control the electrostatic deflector 22 and a current amount $I_B$ of the electron beam emitted to a specimen S. FIG. 5 is a diagram schematically illustrating the electron beam emitted to the specimen S when the electrostatic deflector 22 is operated based on the blanking signal $S_B$, illustrated in FIG. 4. The ratio w/t of the blanking signal $S_B$ in FIG. 4 is larger than the ratio w/t of the blanking signal $S_B$ in FIG. 2.

As illustrated in FIG. 2 to FIG. 5, the illumination dose of the electron beam can be controlled by changing the ratio w/t. Specifically, the illumination dose of the electron beam increases as the ratio w/t increases.

In the case where T is a dwell time of an electron beam in each pixel, when the specimen S is scanned with the electron beam and the scan image thereof is acquired, the control unit 80 controls the blanking device 20 so as to satisfy $T = n \times t$ (where coefficient n is a natural number). The dwell time T is determined by the scanning speed with the electron beam. Specifically, increasing the scanning speed decreases the dwell time T, and decreasing the scanning speed increases the dwell time T. The dwell time T, the cycle t and the coefficient n can be set independently.

By satisfying the relationship $T = n \times t$, the illumination dose of the electron beam in each pixel of the scan image can be constant. This means that the bright and dark fringes on the scan image, caused by switching the electron beam ON/OFF, can be prevented.

Figure 6:
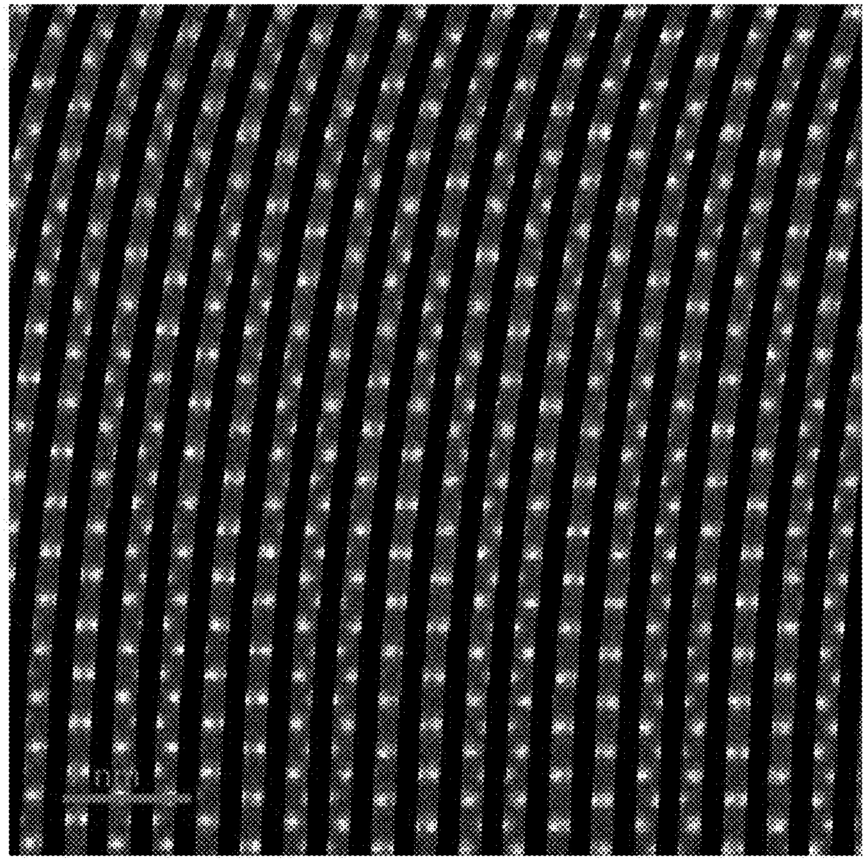
FIG. 6 is an HAADF-STEM image of silicon [110].
Figure 7:
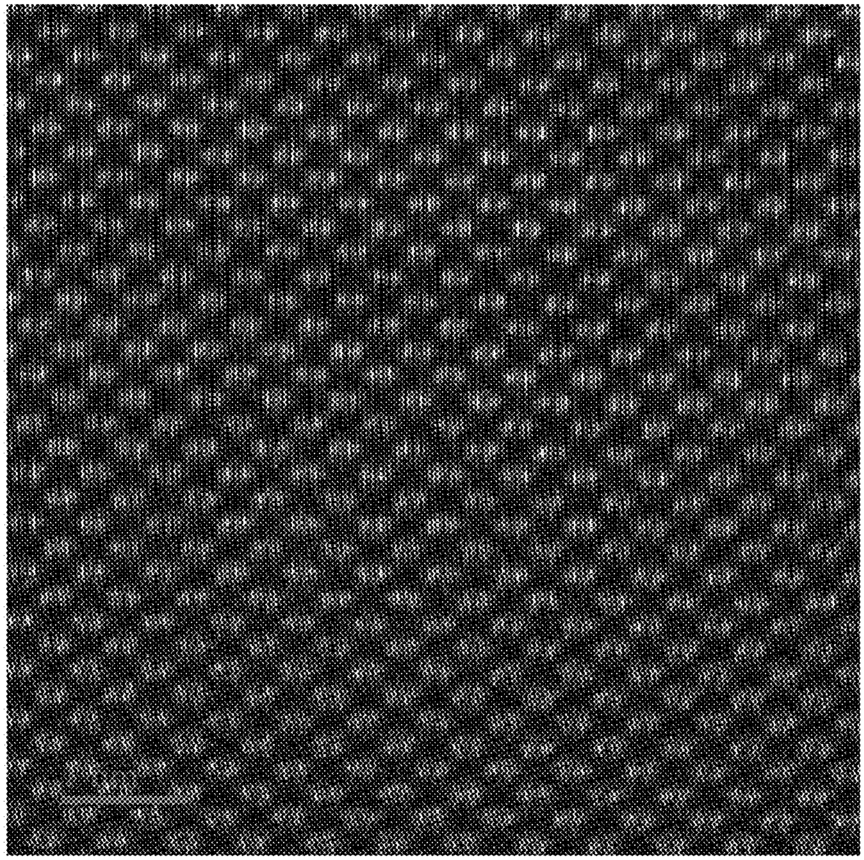
FIG. 7 is an HAADF-STEM image of silicon [110].

FIG. 6 and FIG. 7 are HAADF-STEM images of silicon [110].

FIG. 6 is an HAADF-STEM image acquired when the electrostatic deflector 22 is operated under a condition where the cycle t is 1 millisecond, and the ON time w of the electron beam is 0.5 milliseconds. FIG. 7 is an HAADF-STEM image acquired when the electrostatic deflector 22 is operated under a condition where the cycle t is 0.1 milliseconds, and the ON time w of the electron beam is 50 microseconds.

In the HAADF-STEM images illustrated in FIG. 6 and FIG. 7, the ratio w/t=½ (50%). The dwell time T in each pixel in the HAADF-STEM images illustrated in FIG. 6 and FIG. 7 is 38 microseconds.

The cycle t, when the HAADF-STEM image in FIG. 6 and the HAADF-STEM image in FIG. 7 are captured, is longer than the dwell time T. Therefore, in the HAADF-STEM image in FIG. 6 and the HAADF-STEM image in FIG. 7, pixels to which the electron beam is not emitted are generated, and bright and dark fringes caused by switching the electron beam ON/OFF are generated.

Figure 8:
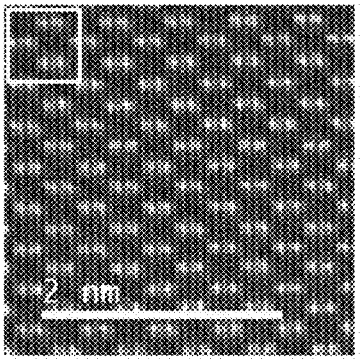
FIG. 8 is an HAADF-STEM image of silicon [110].
Figure 9:
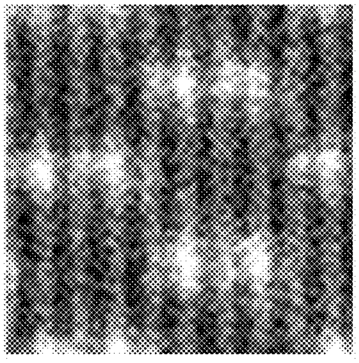
FIG. 9 is an HAADF-STEM image of silicon [110].

FIG. 8 is an HAADF-STEM image of the silicon [110]. FIG. 9 is an enlarged view of the region enclosed by the square in FIG. 8.

The cycle t, when the HAADF-STEM image in FIG. 8 is captured, is shorter than the dwell time T, but does not satisfy T=n×t. Therefore the illumination does of the electron beam in each pixel is not constant. As illustrated in FIG. 8 and FIG. 9, the pixels to which the electron beam is not emitted do not exist, since the cycle t is shorter than the dwell time T, but the illumination dose of the electron beam in each pixel is not constant since T=n×t is not satisfied. As a result, bright and dark fringes caused by switching the electron beam ON/OFF are generated.

Figure 10:
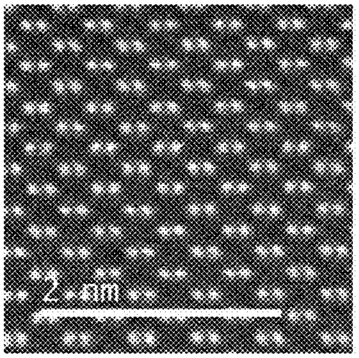
FIG. 10 is an HAADF-STEM image of silicon [110].

FIG. 10 is an HAADF-STEM image of the silicon [110].

The HAADF-STEM image illustrated in FIG. 10 is captured by operating the blanking device 20 so as to satisfy T=n×t. Therefore the illumination dose of the electron beam in each pixel is constant, and the bright and dark fringes caused by switching the electron beam ON/OFF are not generated in the HAADF-STEM image in FIG. 10.

Figure 11:
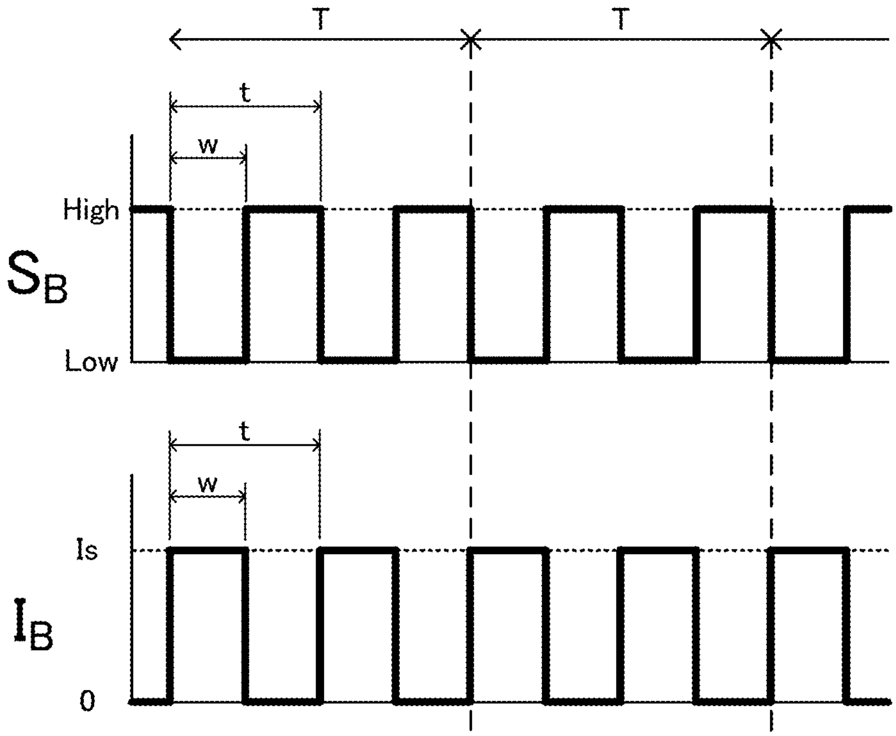
FIG. 11 is a diagram illustrating a blanking signal and a current amount of an electron beam.
Figure 12:
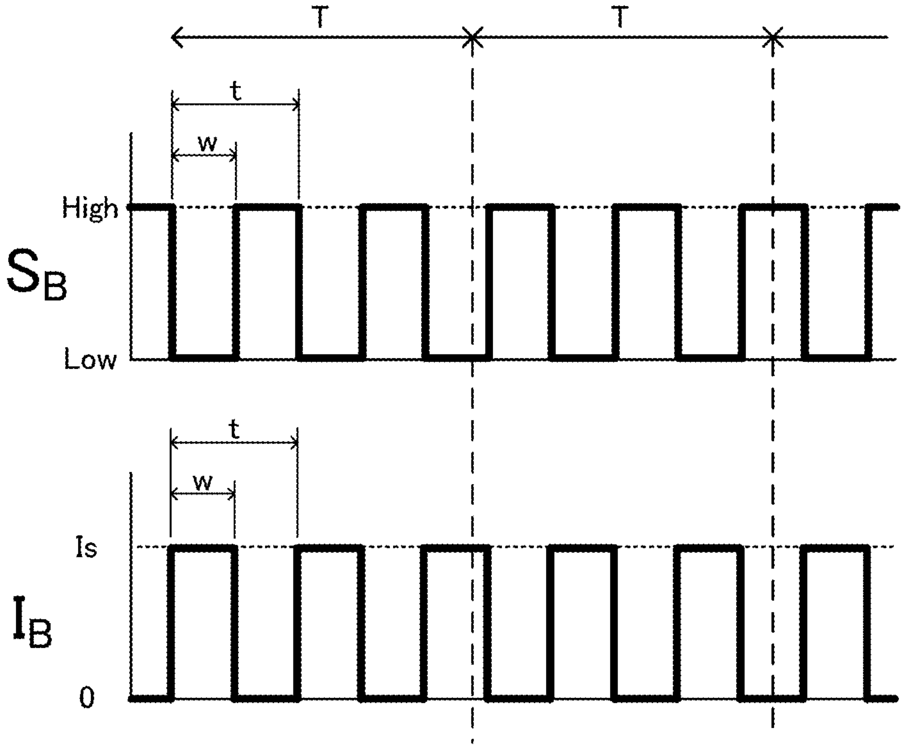
FIG. 12 is a diagram illustrating a blanking signal and a current amount of an electron beam.

FIG. 11 and FIG. 12 are diagrams illustrating a blanking signal $S_B$ to control the electrostatic deflector 22 and a current amount (intensity) $I_B$ of the electron beam emitted to the specimen S respectively. The blanking signal $S_B$ illustrated in FIG. 11 satisfies T=n×t, and the blanking signal $S_B$ illustrated in FIG. 12 does not satisfy T=n×t.

In the case where the blanking signal $S_B$ does not satisfy T=n×t, the illumination dose of the electron beam in each pixel is not constant, as illustrated in FIG. 12. In the case where the blanking signal $S_B$ satisfies T=n×t, on the other hand, the illumination dose of the electron beam in each pixel is constant, as illustrated in FIG. 11.

For example, in the case of the example in FIG. 12, about 2.4 pulse cycles exist in the dwell time T in one pixel. Therefore the illumination dose of the electron beam in each pixel does not become constant. For example, the illumination dose of the electron bean in the first pixel in FIG. 12 is $2.7 \times w \times I_S$, and the illumination does of the electron beam in the second pixel is $2.3 \times w \times I_S$. Thus in the example in FIG. 12, the illumination dose of the electron beam in each pixel is not constant.

In the case of the example in FIG. 11, on the other hand, 2 pulse cycles exist in the dwell time T in one pixel (T=2×t). Therefore the illumination dose of the electron beam in each pixel is constant ($2 \times w \times I_S$).

By operating the blanking device 20 so as to satisfy T=n×t like this, the illumination dose of the electron beam in each pixel becomes constant, and the bright and dark fringes, caused by switching the electron beam ON/OFF, are not generated on the scan image.

1.2.2. Operation to Change Illumination Dose

In the electron microscope 100, when the user specifies the illumination dose of the electron beam, the control unit 80 operates the blanking device 20 so that the specified illumination dose is implemented.

Figure 13:
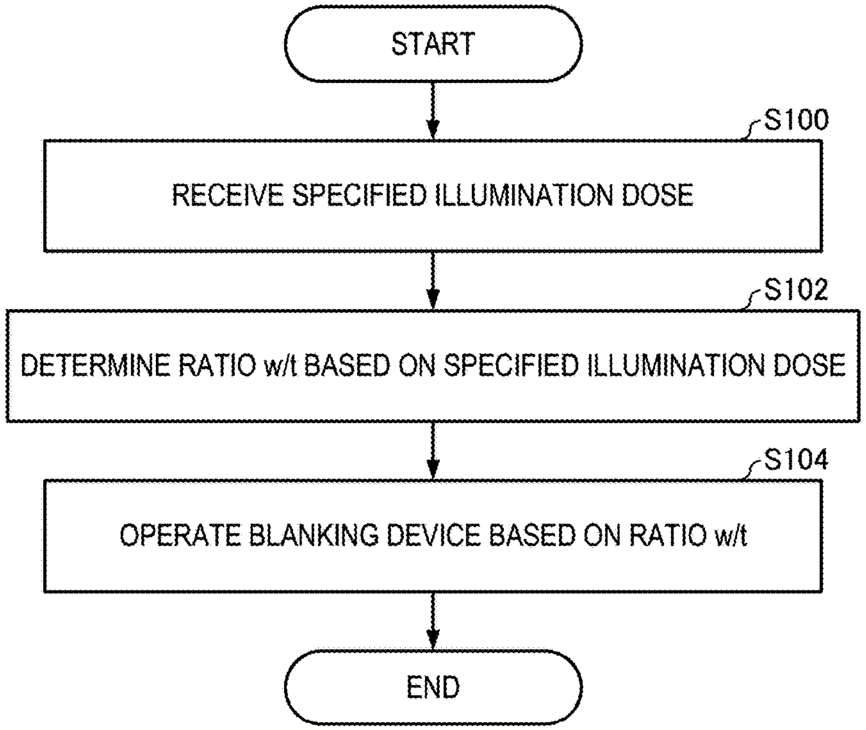
FIG. 13 is a flow chart illustrating an example of processing of the control unit.

FIG. 13 is a flow chart illustrating an example of the processing of the control unit 80.

First the control unit 80 receives information on the specified illumination dose of the electron beam (S100). For example, when the user inputs the illumination dose via the input unit 90, the input unit 90 outputs the information on the inputted illumination dose. The control unit 80 receives the information on the illumination dose outputted by the input unit 90. The illumination dose of the electron beam may be the illumination dose of the electron beam in each pixel, or the illumination dose of the electron beam in each scan image (a one-time scan).

Here the control unit 80 receives the information on the specified illumination dose, but may receive the information on the specified brightness of the image. The brightness of the image corresponds to the illumination dose of the electron beam.

The control unit 80 determines the ratio w/t based on the specified illumination dose (S102).

In the case of increasing the illumination dose, that is, in the case of making the image brighter, the control unit 80 increases the ratio w/t. In the case of decreasing the illumination dose, that is, in the case of making the image darker, the control unit 80 decreases the ratio w/t. For example, a table showing the relationship between the illumination dose of an electron beam and the ratio w/t may be stored in advance in the storage device of the control unit 80, so that the control unit 80 can determine the ratio w/t to implement the specified illumination dose of the electron beam by referring to this table. Further, the control unit 80 may determine the ratio w/t to implement the specified illumination dose of the electron beam using a formula to show the relationship between the illumination dose of the electron beam and the ratio w/t. Here the control unit 80 determines the ratio w/t so as to satisfy T=n×t.

The control unit 80 operates the blanking device 20 based on the ratio w/t that is set (S104). The control unit 80 generates the blanking signal $S_B$ based on the ratio w/t that is set, and sends this blanking signal $S_B$ to the control circuit 70. Thereby the electrostatic deflector 22 operates based on the blanking signal $S_B$. As a result, the illumination dose of the electron beam becomes the specified illumination dose. In other words, the brightness of the scan image becomes the specified brightness.

By the above processing, the illumination dose of the electron beam, that is, the brightness of the image, can be changed.

1.2.3. Operation to Change Acquisition Time of Scan Image

In the electron microscope 100, when the user specifies image acquisition time, the control unit 80 changes the scanning speed of the electron beam, so that the specified image acquisition time is implemented. The image acquisition time is the time that it takes to acquire one scan image.

Figure 14:
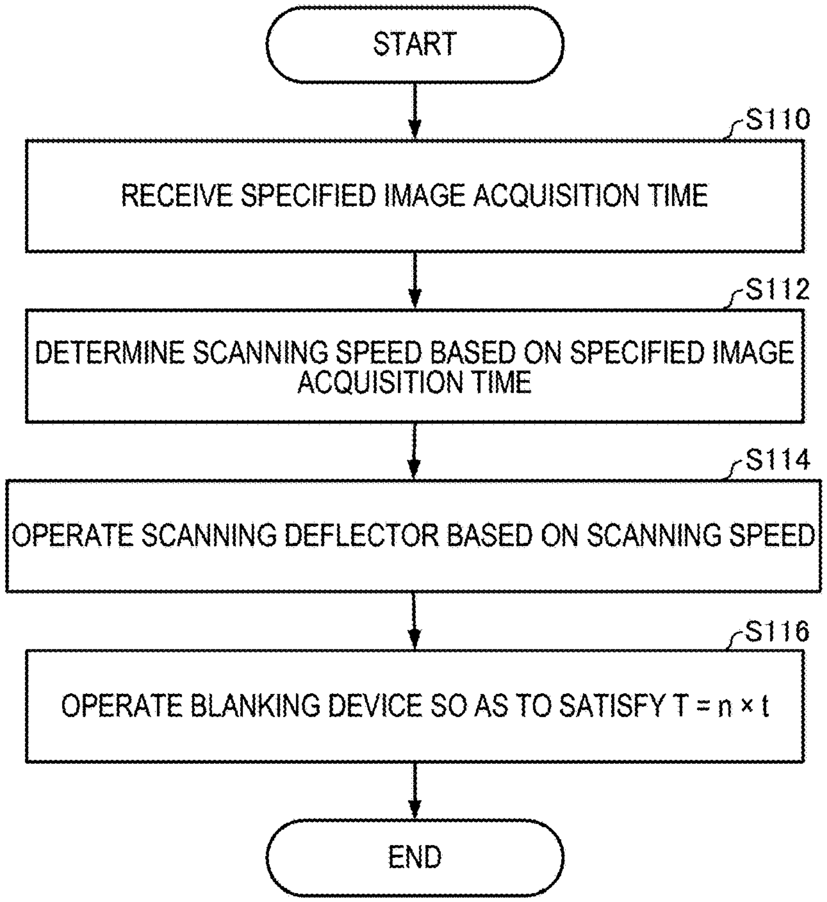
FIG. 14 is a flow chart illustrating an example of processing of the control unit.

FIG. 14 is a flow chart illustrating an example of the processing of the control unit 80.

First the control unit 80 receives information on the specified image acquisition time (S110). For example, when the user inputs the image acquisition time via the input unit 90, the input unit 90 outputs the information on the inputted image acquisition time. The control unit 80 receives the information on the image acquisition time outputted from the input unit 90.

The control unit 80 determines the scanning speed based on the specified image acquisition time (S112), and operates the scanning deflector 40 based on the determined scanning speed (S114). Thereby the scanning speed is changed, and the scan image can be acquired in the specified image acquisition time.

Here changing the scanning speed changes the dwell time T in each pixel. Therefore, the control unit 80 determines the dwell time T at the determined scanning speed, and operates the blanking device 20 so as to satisfy T=n×t (S116).

For example, T=n×t may be satisfied by changing the coefficient n, or T=n×t may be satisfied by changing the cycle t. Here changing the cycle t changes the ratio w/t, which changes the illumination dose. Therefore, the ON time w of the electron beam may be changed, so that the ratio w/t becomes constant even if the cycle t is changed. Then the illumination dose does not change even if the cycle t is changed.

By the above processing, the image acquisition time can be changed.

In the above description, the user specifies the image acquisition time in the processing S110, but the user may specify the scanning speed. In the case where the scanning speed is specified in the processing S110, processing the same as the above-described case of the user specifying the image acquisition time is performed, except that the processing in S112, to determine the scanning speed based on the image acquisition time, is not executed.

1.3. Effects

The electron microscope 100 includes: the illumination optical system 2 including the blanking device 20 that illuminates a specimen S with pulses of the electron beam, and the scanning deflector 40 that deflects the electron beam and scans the specimen S with the electron beam; and the control unit 80 that controls the illumination optical system 2. The control unit 80 controls the illumination optical system 2, so as to satisfy T=n×t (n is a natural number) where T is a dwell time of an electron beam in each pixel of the scan image, and t is a pulse cycle of the electron beam.

In the electron microscope 100, the illumination dose of the electron beam to the specimen S can be controlled by using the blanking device 20 to illuminate the specimen S with pulses of the electron beam.

For example, in a conventional electron microscope, the illumination dose of the electron beam is adjusted by changing the excitation of the condenser lens or by changing the size of the aperture. However, if excitation of the condenser lens is changed, alignment of the axis and adjustment of the aberration correction apparatus are required. Further, if the size of the aperture is changed, adjustment of the aperture is required. If the size of the aperture is changed, the convergence angle of the electron beam also changes.

In the case of the electron microscope 100, on the other hand, the illumination dose of the electron beam can be controlled using the blanking device 20, hence the above problems do not occur. In other words, in the electron microscope 100, the illumination dose of the electron beam can be changed without changing the excitation of the condenser lens, the size of the aperture of the illumination optical system 2, and the like.

In the case of deflecting the electron beam using a magnetic coil or the like in the blanking device 20, it is difficult to accurately control the illumination dose since the influence of magnetic hysteresis must be considered. In the electron microscope 100 however, the electron beam is deflected using the electrostatic deflector 22, hence the illumination dose can be accurately controlled. Furthermore, as described above, if the electron beam can be deflected using the electrostatic deflector 22, the electron beam can be deflected faster than the case of deflecting the electron beam using the magnetic coil.

As described above, in the electron microscope 100, the illumination dose of the electron beam can be accurately controlled at high-speed.

In the electron microscope 100, the illumination optical system 2 is controlled so as to satisfy T=n×t (n is a natural number), where T is a dwell time of an electron beam in each pixel of the scan image, and t is a pulse cycle of the electron beam. Therefore, in the electron microscope 100, generation of the bright/dark fringes on the scan image caused by switching the electron beam ON/OFF can be prevented.

Further, in the electron microscope 100, the electron is emitted to each pixel for a plurality of times when n is a 2 or greater integer, hence damage to the specimen S by the emission of the electron beam can be reduced compared with the case of emitting the electron beam all at once to each pixel, for example.

In the electron microscope 100, the control unit 80 receives the information on the specified illumination dose of the electron beam to the specimen S, and determines the ratio w/t, which is the ratio of the time w of emitting the pulse to the cycle t, based on the specified illumination dose, and operates the blanking device 20 based on the ratio w/t. Therefore, in the electron microscope 100, the illumination dose of the electron beam can be changed to the specified illumination dose, without changing the excitation of the condenser lens, the size of the aperture of the illumination optical system, and the like.

2. Second Embodiment

2.1. Electron Microscope

Figure 15:
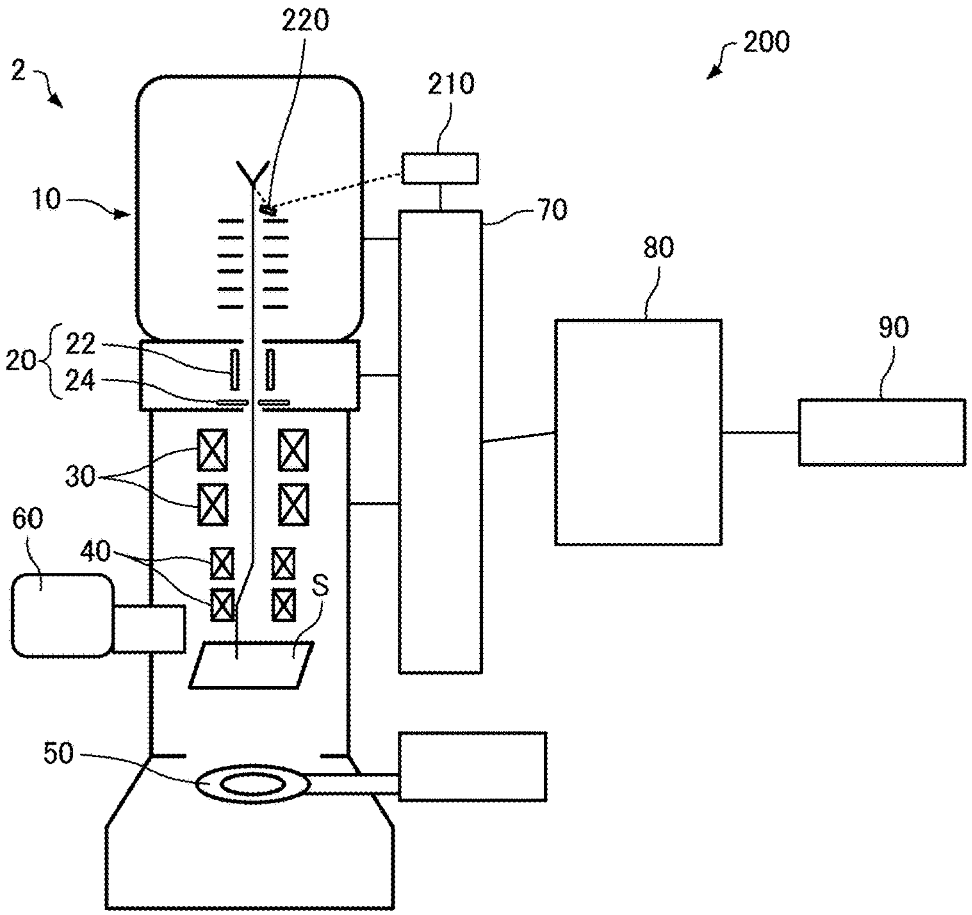
FIG. 15 is a diagram illustrating a configuration of an electron microscope according to the second embodiment.

An electron microscope according to the second embodiment will be described next with reference to the drawings. FIG. 15 is a diagram illustrating a configuration of the electron microscope 200 according to the second embodiment. In the electron microscope 200 according to the second embodiment, a composing element having the same function as a composing element of the electron microscope 100 of the first embodiment is denoted with a same reference sign, and detailed description thereof will be omitted.

In the above-described electron microscope 100 illustrated in FIG. 1, the blanking device 20 functions as a pulse mechanism to illuminate the specimen S with pulses of the electron beam.

The electron microscope 200, on the other hand, includes a light source device 210 which illuminates the electron beam source 10 with light pulses, as illustrated in FIG. 15, and the light source device 210 functions as the pulse mechanism to illuminate a specimen S with pulses of the electron beam. Specifically, the light source device 210 illuminates the electron beam source 10 with light pulses, whereby the electron beam is emitted from the electron beam source 10.

Figure 16:
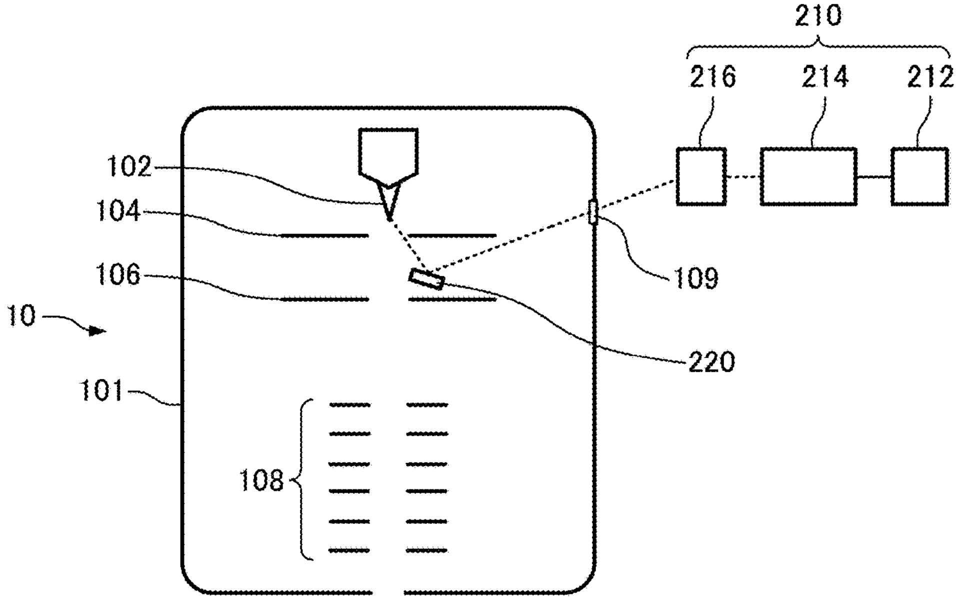
FIG. 16 is a diagram schematically illustrating an electron beam source and a light source device.

FIG. 16 is a diagram schematically illustrating the electron beam source 10 and the light source device 210.

As illustrated in FIG. 16, the electron beam source 10 includes an emitter 102, a first anode electrode 104, a second anode electrode 106 and an acceleration electrode 108.

The emitter 102 is a source of emitting electrons, that is, a cathode. The emitter 102 emits electrons by photoemission. Photoemission is a phenomena where electrons inside a substance, that are excited by light that is applied to the substance, are emitted from the substance.

The first anode electrode 104 is an extraction electrode to extract electrons from the emitter 102. Electrons are extracted from the emitter 102 by a strong electric field generated by the first anode electrode 104.

The second anode electrode 106 forms an electrostatic lens that acts on the electrons extracted from the emitter 102. Specifically, one electrostatic lens is formed by the first anode electrode 104 and the second anode electrode 106, since the first anode electrode 104 and the second anode electrode 106 have a predetermined potential difference. The electron beam is focused by the electrostatic lens formed by the first anode electrode 104 and the second anode electrode 106.

The acceleration electrode 108 is an electrode to accelerate the electrons extracted from the emitter 102. The electrons extracted from the emitter 102 are accelerated by the acceleration electrode 108, and emitted from the electron beam source 10.

The emitter 102, the first anode electrode 104, the second anode electrode 106 and the acceleration electrode 108 are disposed inside a chamber 101. In the chamber 101, a window 109 is formed to introduce a pulsed laser beam from the outside.

The light source device 210 illuminates the electron beam source 10 (emitter 102) with pulses of a laser beam (excitation light). The light source device 210 includes a timing signal generation device 212, a pulsed laser generation device 214 and a laser optical system 216, for example.

The timing signal generation device 212 generates a timing signal. The pulsed laser generation device 214 is a laser device in which a laser beam is oscillated as pulses. The laser optical system 216 focuses the laser beam.

In the light source device 210, the pulsed laser generation device 214 generates a pulsed laser beam triggered by a timing signal generated by the timing signal generation device 212. The pulsed laser beam emitted from the pulsed laser generation device 214 passes through the laser optical system 216, and is introduced into the chamber 101 through the window 109 of the chamber 101.

Here the case of outputting the pulsed laser beam using the pulsed laser generation device 214 was described, but by using a laser device that continuously oscillates a laser beam, the continuously oscillated laser beam may be pulsed and outputted by external processing. The electron microscope 200 includes a mirror 220, as illustrated in FIG. 16. The mirror 220 reflects the pulsed laser beam introduced through the window 109. As a result, the emitter 102 is illuminated with pulses of the pulsed laser beam. The pulse mechanism for illuminating the specimen S with the electron beam may include the mirror 220 in this way.

In the example illustrated in FIG. 16, the mirror 220 is disposed between the first anode electrode 104 and the second anode electrode 106. However, the position of the mirror 220 is especially limited, as long as the mirror 220 can guide the pulsed laser beam introduced through the window 109 to the emitter 102. Further, the pulsed laser beam introduced through the window 109 may be directly emitted to the emitter 102 without disposing the mirror 220, or the pulsed laser beam introduced through the window 109 may be guided to the emitter 102 using a plurality of mirrors or other optical elements.

When the pulsed laser beam is emitted to the emitter 102, a pulsed electron beam is acquired in the emitter 102 by photoemission. The cycle t of the pulse of the electron beam acquired like this is controlled so as to satisfy $T=n\times t$, just like the electron microscope 100.

The optical system disposed after the electron beam source 10 of the electron microscope 200 is the same as the electron microscope 100.

2.2. Operation

The operation of the electron microscope 200 is the same of the operation of the electron microscope 100 described above, except that the electron beam source 10 is illuminated with pulses of the laser beam, whereby the electron beam is emitted as pulses from the electron beam source 10, hence description thereof will be omitted.

2.3. Effect

As a pulse mechanism for illumination with pulses of an electron beam, the electron microscope 200 includes the light source device 210 that illuminates the electron beam source 10 (emitter 102) with light pulses, and an electron beam is emitted from the electron beam source 10 as pulses by illuminating the electron beam source 10 with light pulses. Therefore, the electron microscope 200 can illuminate a specimen S with pulses of the electron beam, and can implement the same functional effects as the electron microscope 100.

2.4. Modification

Figure 17:
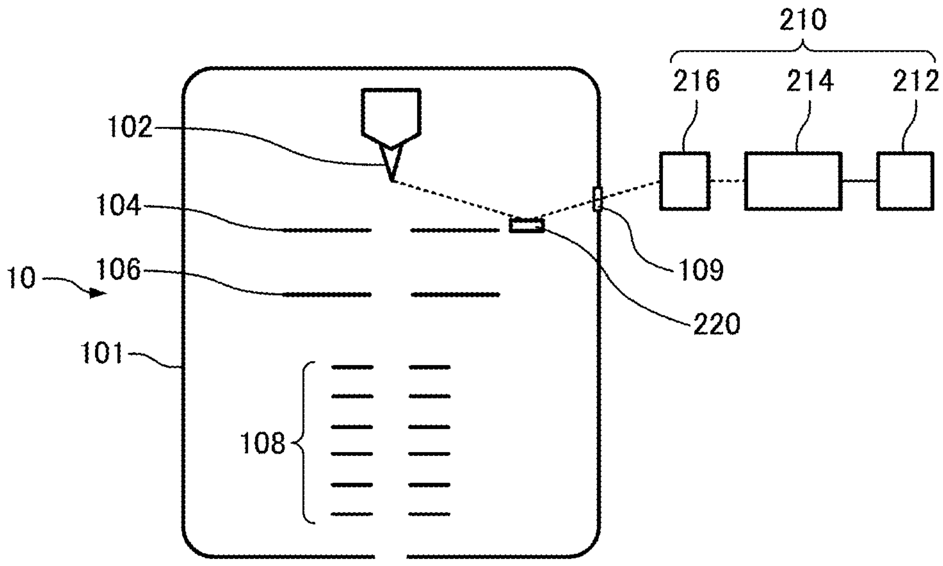
FIG. 17 is a diagram schematically illustrating a modification of the electron beam source and the light source device.

FIG. 17 is a diagram schematically illustrating a modification of the electron beam source 10 and the light source device 210. In the above-described example illustrated in FIG. 16, the mirror 220 is disposed between the first anode electrode 104 and the second anode electrode 106, and the pulsed laser beam is emitted to the emitter 102 passing through the space between the first anode electrode 104 and the second anode electrode 106.

In the example illustrated in FIG. 17, on the other hand, the mirror 220 is disposed at the same height as the first anode electrode 104, and the pulsed laser beam reflected by the mirror 220 is emitted to the emitter 102 passing through the space above the first anode electrode 104. For example, the pulsed laser beam introduced through the window 109 is reflected by the mirror 220, and is emitted to the emitter 102 passing through the space between the emitter 102 and the first anode electrode 104. The pulsed laser beam does not pass through the space between the first anode electrode 104 and the second anode electrode 106.

The position of the mirror 220, however, is not especially limited, as long as the pulsed laser beam is emitted to the emitter 102 passing through the space above the first anode electrode 104. Further, without disposing the mirror 220, the pulsed laser beam introduced through the window 109 may pass through the space above the first anode electrode 104, and directly emit to the emitter 102.

3. Modification

In the first embodiment and the second embodiment described above, the charged particle beam apparatus according to the invention is the scanning transmission electron microscope (STEM), but the charged particle beam apparatus according to the invention is not limited thereto. For example, the charged particle beam apparatus according to the invention may be a focused ion beam apparatus that acquires a scan image by scanning a specimen with an ion beam. Furthermore, the charged particle beam apparatus according to the invention may be a scanning electron microscope (SEM), an electron probe microanalyzer (EPMA), an Auger microprobe apparatus (Auger), or the like, for example.

In the first embodiment described above, the specimen is illuminated with pulses of the electron beam, and the STEM image is acquired by detecting electrons transmitted through the specimen, for example, but the charged particle beam apparatus according to the invention is not limited thereto. For example, a specimen is illuminated with pulses of an electron beam, and an element distribution map is acquired by detecting the X-ray emitted from the specimen. In this case as well, the illumination dose of the electron beam can be changed by changing the ratio w/t, and the illumination dose of the electron beam in each pixel can be constant by satisfying T=n×t.

As described above, the invention can be applied to various apparatuses where the charged particle beam source emits such a charged particle beam as an electron beam and an ion beam, a pulse mechanism illuminates a specimen with pulses of the charged particle beam, signals generated from the specimen are detected by the detector, and a scan image is acquired thereby. The signals generated from the specimen are: secondary electrons, reflection electrons, backscattered electrons, continuous X-rays, Auger electrons, cathode luminescence emission, visible light emission, inelastically scattered electrons, elastically scattered electrons, transmitted electrons, Bremsstrahlung X-rays, and the like.

The invention is not limited to the above-described embodiments, and various modifications can be made. For example, the invention includes configurations that are substantially the same as the configurations described in the embodiments. Substantially same configurations mean configurations having the same functions, methods and results, or configurations having the same objectives and effects as those of the configurations described in the embodiments, for example. The invention also includes configurations obtained by replacing non-essential elements of the configurations described in the embodiments with other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

The invention claimed is:

1. A charged particle beam apparatus for scanning a specimen with a charged particle beam and acquiring a scan image, the charged particle beam apparatus comprising:

an optical system comprising a pulse mechanism for illuminating the specimen with pulses of the charged particle beam, and a deflector that deflects the charged particle beam and scans the specimen with the deflected charged particle beam; and a control unit configured to control the optical system, wherein the control unit controls the optical system so as to satisfy T=n×t (n is a natural number), where T represents a dwell time of the charged particle beam in each pixel of the scan image, and t represents a cycle of pulses of the charged particle beam, the control unit receives specification of an illumination dose of the charged particle beam to the specimen, the control unit determines a ratio w/t, where w represents an illumination time of the charged particle beam to the specimen in one cycle, based on the specified illumination dose, and the control unit operates the pulse mechanism based on the ratio w/t.

2. The charged particle beam apparatus according to claim 1, wherein the pulse mechanism comprises a blanking device that deflects and blocks the charged particle beam.

3. The charged particle beam apparatus according to claim 1, wherein the optical system further comprises a charged particle beam source that emits the charged particle beam, the pulse mechanism comprises a light source device that illuminates the charged particle beam source with light pulses, and the charged particle beam is emitted as pulses from the charged particle beam source by illuminating the charged particle beam source with light pulses.

4. The charged particle beam apparatus according to claim 1, further comprising a detector that detects a signal generated from the specimen by illuminating the specimen with the charged particle beam.

5. The charged particle beam apparatus according to claim 1, wherein the control unit controls the optical system so as to satisfy T=n×t (t is an integer of 2 or greater).

6. A control method for a charged particle beam apparatus that comprises an optical system comprising a pulse mechanism and a deflector, and acquires a scan image by scanning a specimen with a charged particle beam, the pulse mechanism illuminating the specimen with pulses of the charged particle beam, and a deflector deflecting the charge particle beam and scanning the specimen with the deflected charged particle beam, the method comprising:

controlling the optical system so as to satisfy T=n×t (n is a natural number), where T represents a dwell time of the charged particle beam in each pixel of the scan image, and t represents a cycle of pulses of the charged particle beam;

receiving specification of an illumination dose of the charged particle beam to the specimen;

determining a ratio w/t, where w represents an illumination time of the charged particle beam to the specimen in one cycle, based on the specified illumination dose; and operating the pulse mechanism based on the ratio w/t.

* * * * *